United States Patent [19]
Udagawa et al.

[11] Patent Number: 5,480,492
[45] Date of Patent: Jan. 2, 1996

[54] METHOD FOR REMOVING ORGANIC OR INORGANIC CONTAMINANT FROM SILICON SUBSTRATE SURFACE

[75] Inventors: Masaharu Udagawa, Tokyo; Juro Yasui, Toyonaka; Masaaki Niwa, Hirakata; Yoshihiko Hirai, Osaka; Kenji Okada, Suita; Kiyoshi Morimoto; Koichiro Yuki, both of Neyagawa, all of Japan

[73] Assignee: Matsushita Electric Industrial Co., Ltd., Osaka, Japan

[21] Appl. No.: 136,197

[22] Filed: Oct. 15, 1993

[30] Foreign Application Priority Data

Nov. 10, 1992 [JP] Japan ................... 4-299482

[51] Int. Cl.$^6$ ................ C23G 5/00; B44C 1/22
[52] U.S. Cl. ................ 134/2; 134/1.3; 134/42; 156/643.1
[58] Field of Search .............. 134/2, 42, 1; 156/643, 156/662

[56] References Cited

U.S. PATENT DOCUMENTS

| | | | |
|---|---|---|---|
| 4,687,544 | 8/1987 | Bersin | 156/643 |
| 4,906,328 | 3/1990 | Freeman et al. | 156/643 |
| 5,028,560 | 7/1991 | Tsukamoto et al. | 437/81 |
| 5,041,362 | 8/1991 | Douglas | 430/313 |
| 5,294,571 | 3/1994 | Fujishiro et al. | 437/239 |

FOREIGN PATENT DOCUMENTS

| | | |
|---|---|---|
| 58-192330 | 11/1983 | Japan . |
| 63-5331 | 1/1988 | Japan . |
| 63-228620 | 9/1988 | Japan . |
| 3253020 | 11/1991 | Japan ................... 134/1 |
| 4132222 | 5/1992 | Japan . |

OTHER PUBLICATIONS

Tetsuya Kaneko et al.; "Low Temperature Silicon Surface Cleaning by HF Etching/Ultraviolet Ozone Cleaning (HF/UVOC) Method (II)–in situ UVOC"; Japanese Journal of Applied Physics—vol. 28, No. 12, Dec. 1989, Tokyo JP pp. 2425–2429.
Michiharu Tabe; "UV Ozone Cleaning of Silicon Substrates in Silicon Molecular Beam Epitaxy"; Applied Physics Letters—vol. 45, No. 10, Nov. 1984, New York US pp. 1073–1075.
J. K. Watanabe et al.; "Excimer Laser Cleaning and Processing of Si(100) Substrates in Ultrahigh Vacuum and Reactive Gases"; Journal of Vacuum Science and Technology: Part A.—vol. 10, No. 4, Aug. 1992, New York US pp. 823–828.
Yi Ma et al.; "Si/SiO$_2$ Interfaces Formed by Remote Plasma–Enhanced Chemical Vapor Deposition of SiO$_2$ on Plasma–Processed Si Substrates"; Journal of vacuum Science and Technology: Part A.–vol. 10, No. 04, Aug. 1992, New York US pp. 781–787.
R. E. Thomas et al.; "Carbon and Oxygen Removal from Silicon (100) Surfaces by Remote Plasma Cleaning Techniques"; Journal of Vacuum Science and Technology: Part A.–vol. 10, No. 04, Aug. 1992, New York US pp. 817–822.

*Primary Examiner*—Paul Lieberman
*Assistant Examiner*—Lorna M. Douyon
*Attorney, Agent, or Firm*—Stevens, Davis, Miller & Mosher

[57] ABSTRACT

For removing an unnecessary substance on a silicon substrate surface, a temperature of the unnecessary substance on the silicon substrate surface is not less than 750° C. when the unnecessary substance is exposed to a gas including ozone.

21 Claims, 7 Drawing Sheets

F I G. 2
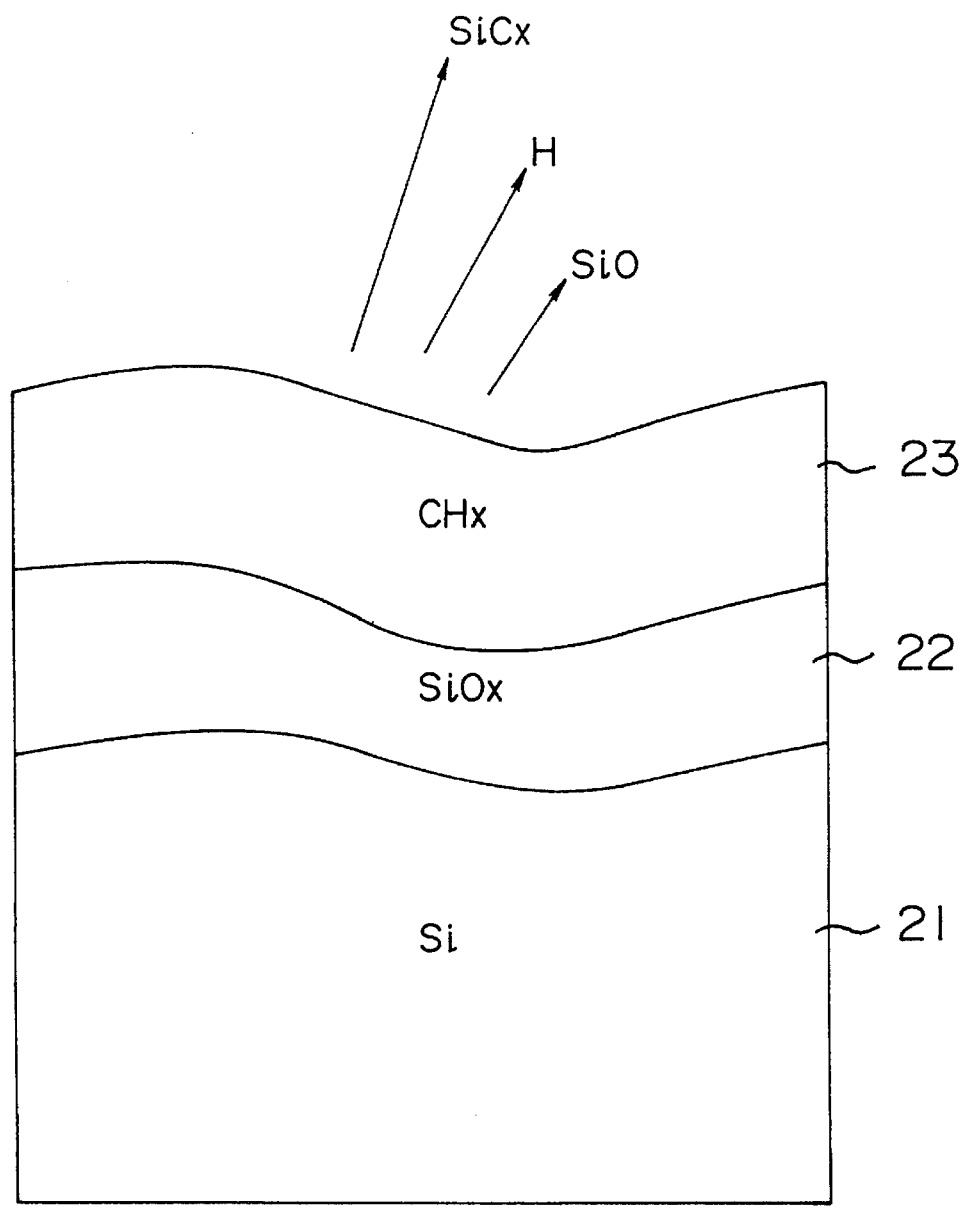

METHOD FOR REMOVING ORGANIC OR INORGANIC CONTAMINANT FROM SILICON SUBSTRATE SURFACE

BACKGROUND OF THE INVENTION AND RELATED ART STATEMENT

The present invention relates to a method for removing an unnecessary substance from a silicon substrate surface.

In the prior art as shown in FIG. 2, an unnecessary SiOx (Silicon oxide) film 22 and an unnecessary CHx (hydrocarbon) film 23 on a Si (Silicon) substrate 21 are heated to a temperature not less than 750° C. in vacuum circumstances with a pressure not larger than $10^{-7}$ Pa so that the SiOx film 22 is changed to SiO to be removed from the Si substrate 21 and H (hydrogen) of the CHx film 23 is removed therefrom. But at least a part of C (carbon) of the CHx (hydrocarbon) film 23 remains on the Si substrate 21 and a SiCx compound is formed.

Subsequently, in order to form an ultra-clean surface composed of planar terraces 31 and steps 33 on a cleaned Si substrate 31a shown in FIG. 3, the SiCx compound including the remaining C is removed from the Si substrate 21 by being heated to a temperature not less than 1100° C., alternatively, as shown in FIG. 4, the remaining C is removed from a Si substrate 36 by being exposed to ozone which is generated by applying ultraviolet rays to $O_2$ gas.

OBJECT AND SUMMARY OF THE INVENTION

An object of the present invention is to provide a method for removing an unnecessary substance from a silicon substrate surface, by which method a roughness of the silicon substrate surface is improved, an undesirable deformation thereof is prevented and an unnecessary diffusion of impurities in the silicon substrate is prevented. This invention is particularly preferable for making an ultimate cleanness, ultimate flatness and ultimate shape regularity of the silicon substrate surface.

According to the present invention, for removing an unnecessary substance on a silicon substrate surface, a temperature of the unnecessary substance on the silicon substrate surface is not less than 750° C. when the unnecessary substance is exposed to a gas including ozone. Since the gas including the ozone is applied to the unnecessary substance having the temperature not less than 750° C., the unnecessary substance is removed from the silicon substrate surface through a chemical action caused by a combination of the ozone and the high temperature not less than 750° C. and a movement of silicon atoms and/or silicon crystal lattice imperfection in the silicon substrate toward a stable position thereof is accelerated by a simultaneous cooperation of the removal of the unnecessary substance and the high-temperature heating so that the ultimate cleanness, ultimate flatness and ultimate shape regularity of the silicon substrate surface are obtained.

The unnecessary substance on the silicon substrate surface may be heated to the temperature not less than 750° C. after being exposed to the gas, before being exposed to the gas or substantially simultaneously with being exposed to the gas. It is preferable for obtaining a constant cleanness, flatness and shape regularity over the whole of the silicon substrate surface that the unnecessary substance on the silicon substrate surface is exposed to the gas including the ozone before at least a part of the silicon oxide over the silicon substrate surface is removed substantially completely in such a degree that an undesirable chemical change of the silicon substrate surface is generated locally by at least one of the heating of silicon substrate and the gas.

The unnecessary substance may include a silicon oxide and/or hydrocarbon. It is preferable for preventing an undesirable deformation of the silicon substrate surface that the temperature is not larger than 1100° C. It is preferable for accelerating the removal or vaporization of the unnecessary substance from the silicon substrate surface that a circumferential gas pressure over the unnecessary substance on the silicon substrate surface is low, for example, not higher than the atmospheric pressure. It is preferable for preventing a silicon oxide from remaining or being generated excessively on the silicon substrate surface that a partial pressure formed by oxygen or by at least one of oxygen atomics (O), oxygen molecules ($O_2$) and ozone molecules ($O_3$) over the unnecessary substance on the silicon substrate surface is not higher than $10^1$ Pa, more preferably than $10^{-4}$ Pa. It is preferable that the gas is substantially prevented from including at least one of carbon and carbide. The gas may include at least one of oxygen molecule, hydrogen molecule and inert gas.

The ozone may be formed by applying ultraviolet rays to oxygen molecule in the gas. The ozone may be formed over the unnecessary substance by supplying both of ultraviolet rays and oxygen molecule gas onto the unnecessary substance. It is preferable for accelerating the removal of the unnecessary substance from the silicon substrate surface that the gas flows onto the unnecessary substance. The silicon substrate surface may be also heated to the temperature not less than 750° C.

It is preferable for preventing an unnecessary chemical action of the silicon substrate surface that the ozone is substantially completely discharged from the silicon substrate surface when the silicon substrate surface is cooled below 750° C., after the unnecessary substance on the silicon substrate surface is kept at the temperature not less than 750° C. while being exposed to the gas. It is preferable for accelerating the removal of the unnecessary substance from the silicon substrate surface that the gas flows from the silicon substrate surface toward an area whose gas pressure is not higher than $10^{-7}$ Pa.

BRIEF DESCRIPTION OF THE DRAWINGS

FIG. 2 is a schematic cross-sectional view showing a well-known method for removing a silicon oxide and carbon of hydrocarbon from a silicon substrate.

DETAILED DESCRIPTION OF THE PREFERRED EMBODIMENTS

Figure 1:
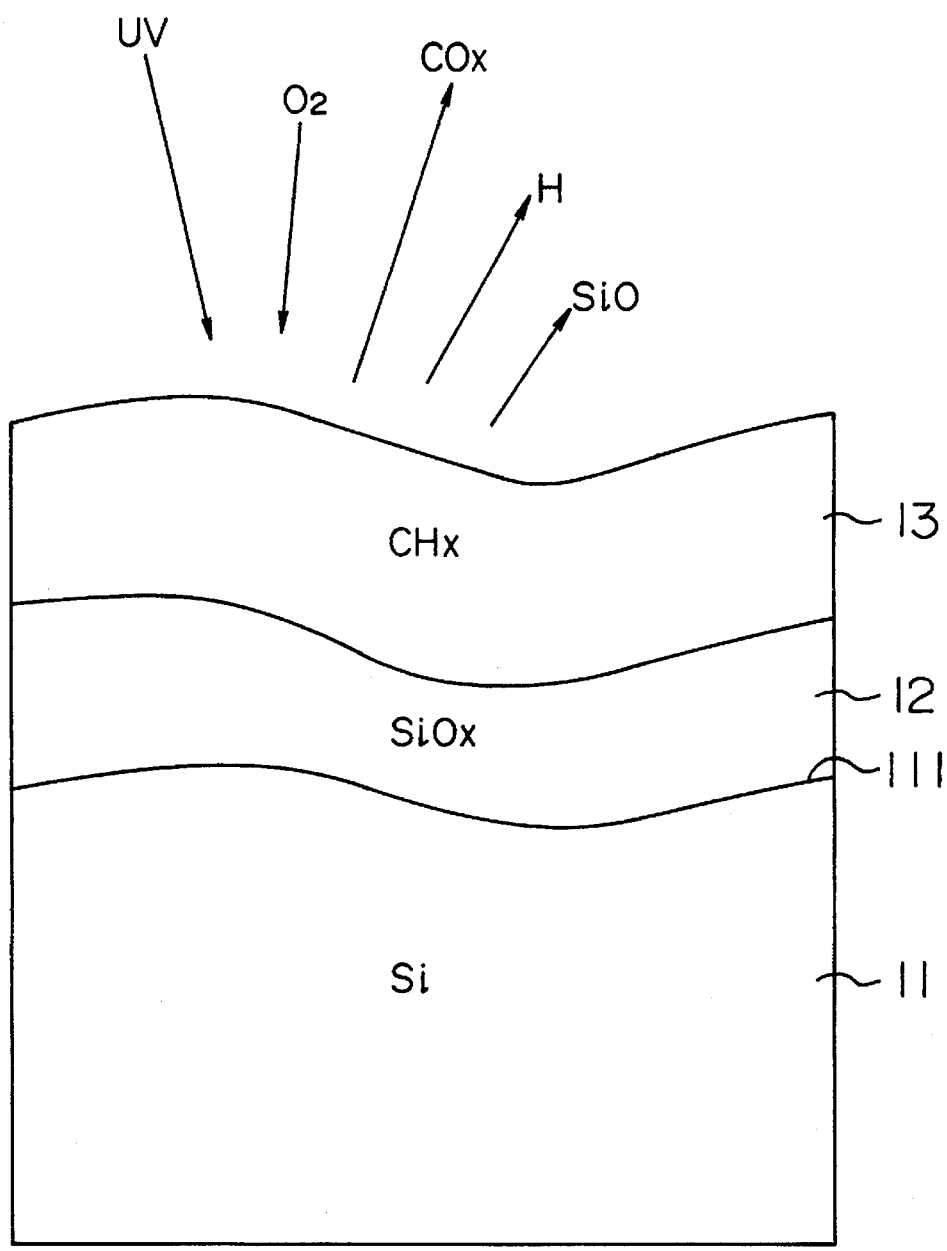
FIG. 1 is a schematic cross-sectional view showing an embodiment method of the present invention.
Figure 3:
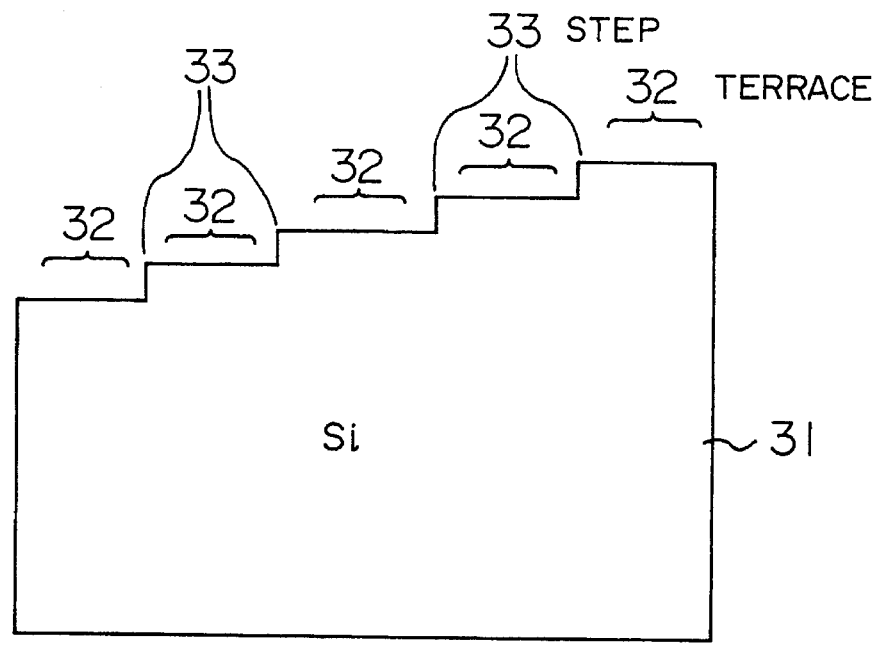
FIG. 3 is a schematic cross-sectional view showing a desirable silicon surface shape obtained by removing unnecessary substances thereon.
Figure 6:
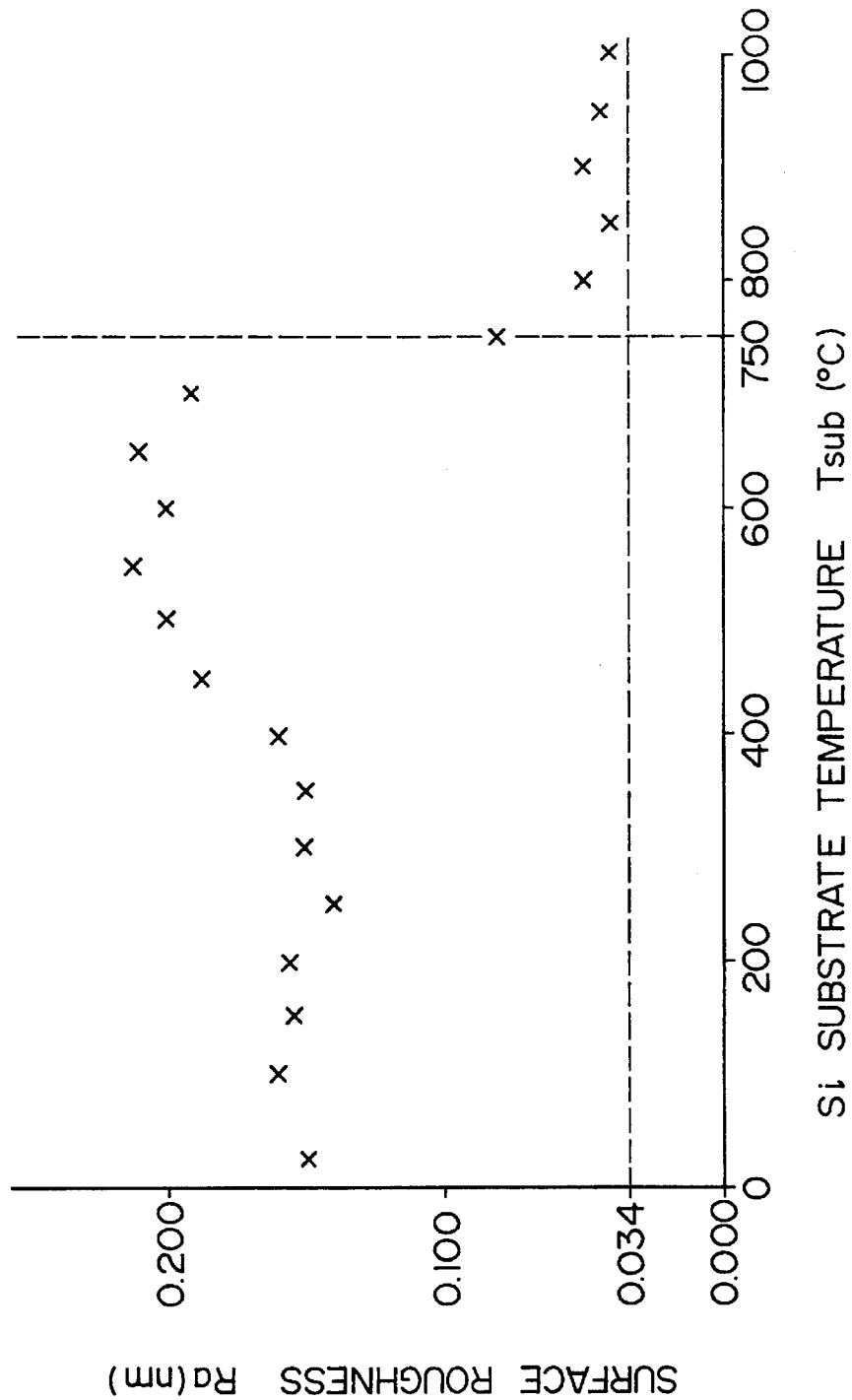
FIG. 6 is a diagram showing a relation between a silicon substrate surface temperature and an obtained silicon substrate surface roughness in the present invention.

Generally, as shown in FIG. 1, a silicon substrate 11 is covered by a silicon oxide (SiOx) 12 and a hydrocarbon (CHx) 13. A reference numeral "111" indicates the claimed silicon substrate surface. By heating the silicon oxide 12 and the hydrocarbon 13 to a temperature not less than 750° C. and by applying simultaneously ozone to the silicon oxide 12 and the hydrocarbon 13, hydrogen of the hydrocarbon 13 is removed from the hydrocarbon 13 and the silicon substrate 11, carbon of the hydrocarbon 13 is changed to carbon oxide (COx) to be removed from the silicon substrate 11, the silicon oxide (SiOx) 12 is changed to another silicon oxide (SiO) to be removed from the silicon substrate 11, and a movement and/or diffusion of silicon atoms and/or silicon crystal imperfection in the silicon substrate 11 toward a stable position thereof is accelerated by a simultaneous cooperation of the removal of the unnecessary substance by the ozone and the high-temperature heating not less than 750° C. so that the ultimate cleanness, ultimate flatness and ultimate shape regularity of the silicon substrate surface as shown in FIGS. 3 and 6 are obtained. FIG. 6 shows a critical temperature for improving the flatness. When widths of terraces 32 are constant, a roughness Ra is substantially one quarter of a height of steps 33. Therefore, when a (001) surface of a silicon substrate 31 is cleaned by the present invention, the roughness Ra can be reduced to 0.034 nm because of the height 0.136 nm of the steps 33.

Figure 5:
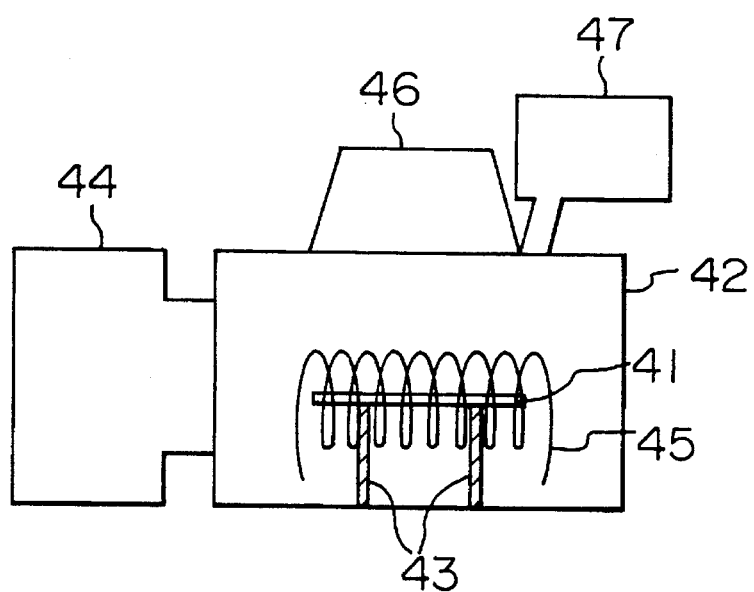
FIG. 5 is a schematic partially cross-sectional view showing an embodiment device of the present invention.
Figure 4:
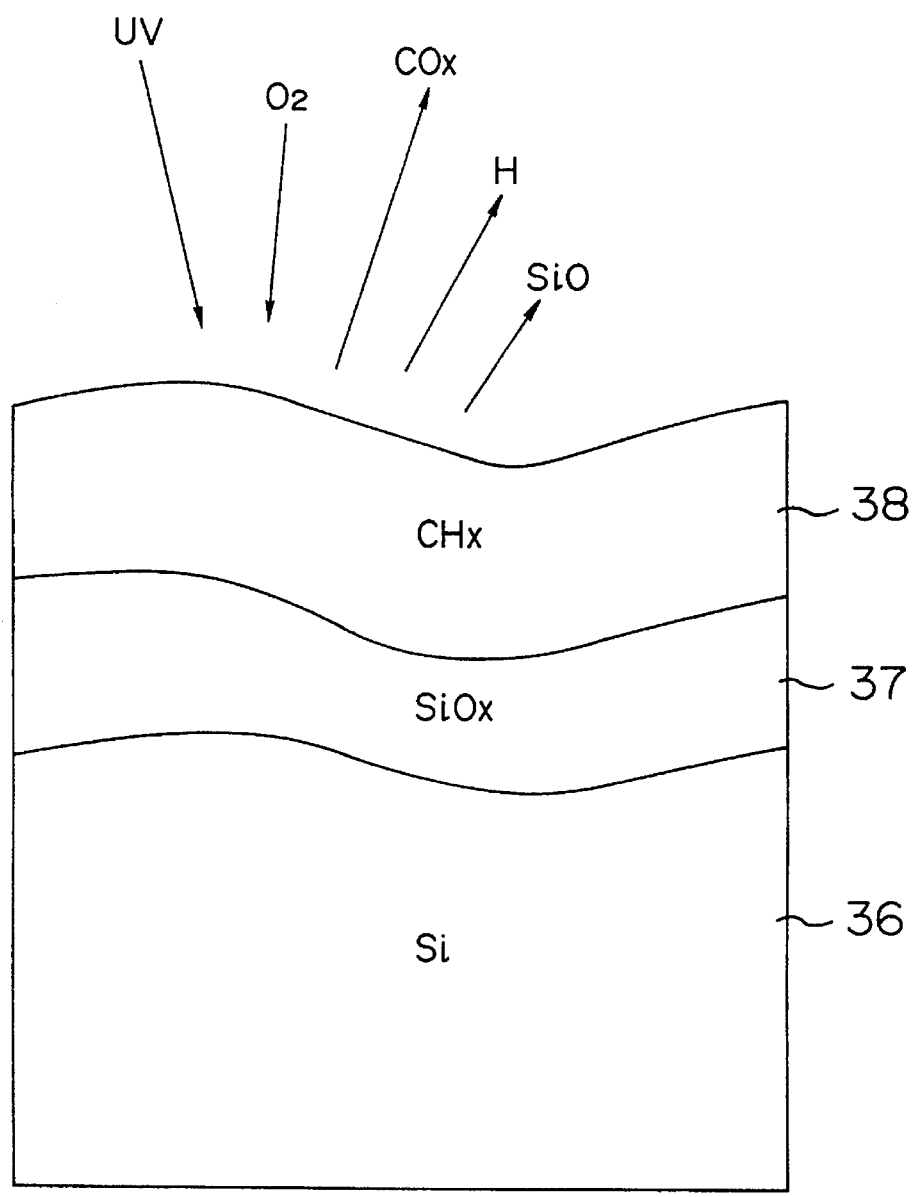
FIG. 4 is a schematic cross-sectional view showing a well-known method for removing remaining carbon of the hydrocarbon from the silicon substrate.
Figure 9:
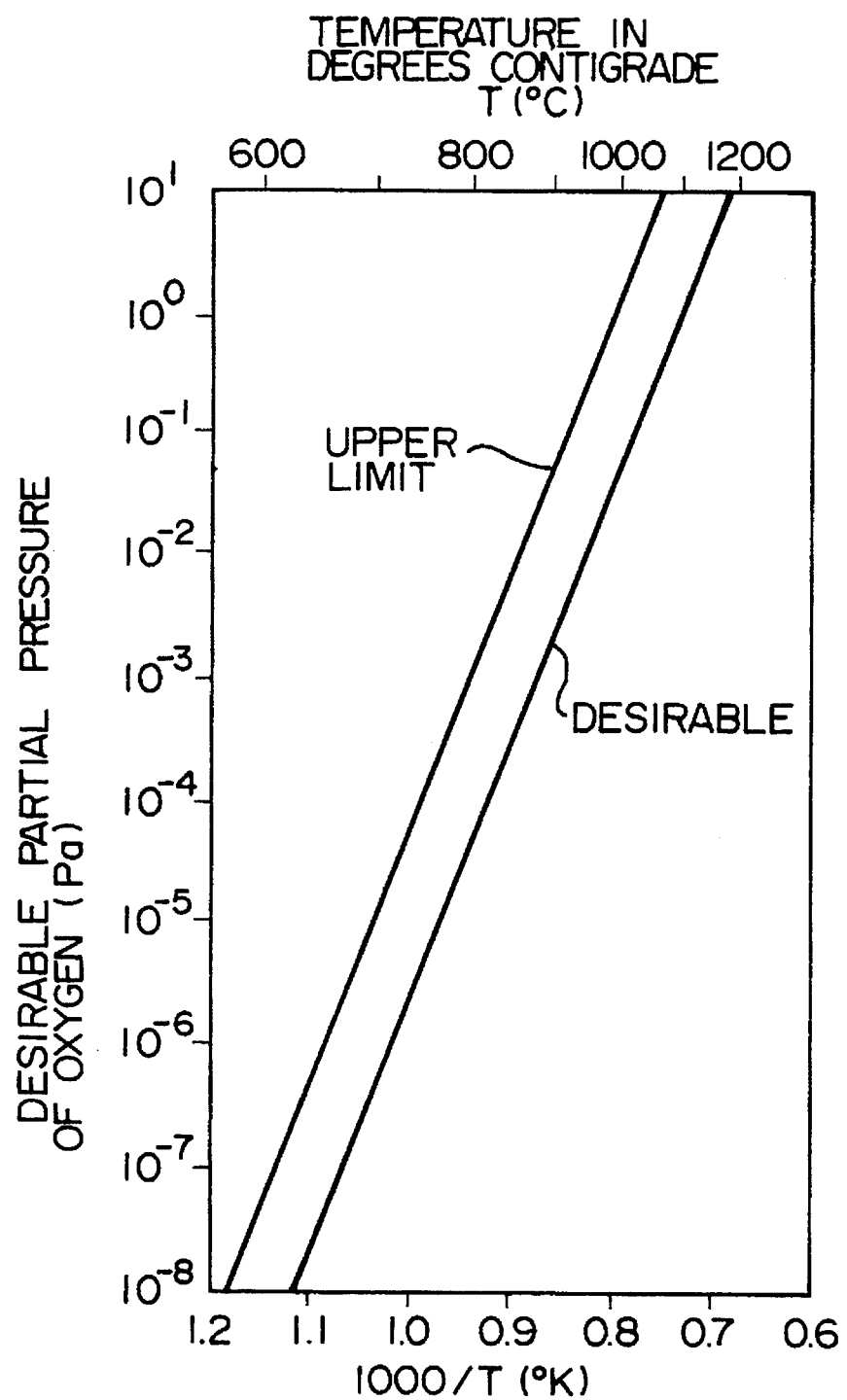
FIG. 9 is a diagram showing a relation between a preferable partial pressure of oxygen (including at least one of oxygen atoms, oxygen molecules and ozone molecules) and the silicon substrate surface temperature in the present invention.

In a silicon substrate surface cleaning device as shown in FIG. 5, a silicon substrate 41 is arranged on a support device 43 in a vacuum container 42. While a background pressure in the vacuum container 42 is kept less than $10^{-7}$ Pa by a vacuum pump 44, unnecessary substances and the silicon substrate 41 are heated to a temperature not less than 750° C. by a heater device 45, ultraviolet rays are applied to the silicon substrate 41 by a ultraviolet rays generator 46 and an oxygen ($O_2$) gas is applied to the silicon substrate 41 by an oxygen induction device 47 to generate a partial pressure not higher than $10^{-4}$ Pa of oxygen over the silicon substrate 41, so that ozone is generated over the silicon substrate 41 from the oxygen of partial pressure not higher than $10^{-4}$ Pa. A desirable or upper limit partial pressure of oxygen may be changed as shown in FIG. 9. The pressure in the container 42 may be more than the atmospheric pressure, but it is preferable for preventing substantially at least one of carbon and carbide from being included by the gas that an inside of the container 42 is vacuumed. If a temperature of the silicon substrate 41 is kept below 1100° C., an undesirable deformation and increase in silicon crystal lattice imperfection of the silicon substrate 41, an undesirable gas generation from the silicon substrate 41 and an undesirable diffusion of impurities contained in the silicon substrate 41 are prevented.

Figure 7:
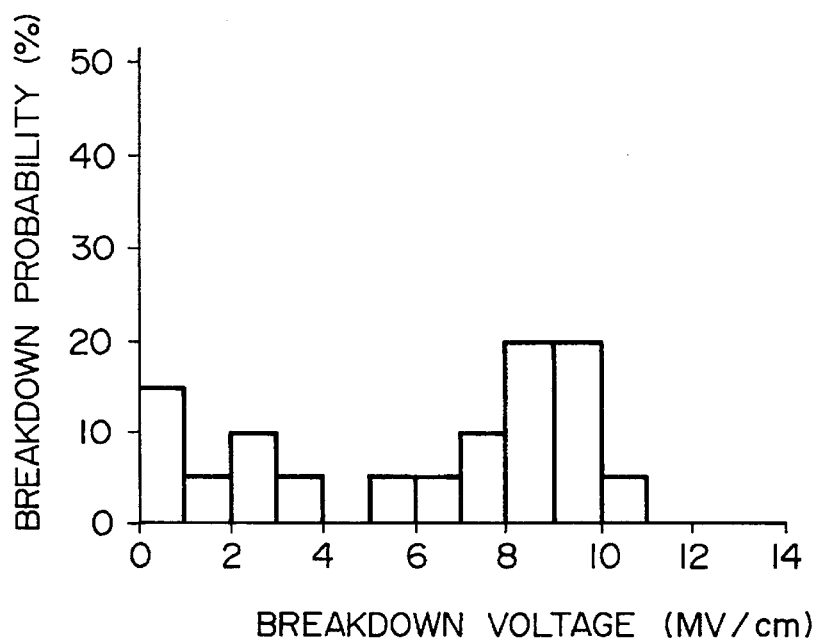
FIG. 7 is a diagram showing a relation between a breakdown voltage and a breakdown probability in MOS capacitor made through a combination of methods shown in FIGS. 2 and 4.
Figure 8:
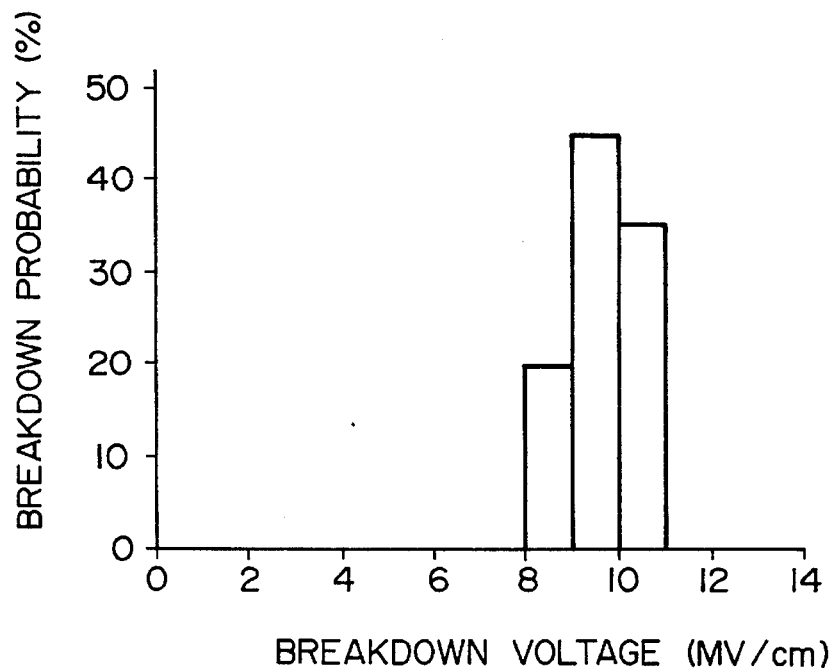
FIG. 8 is a diagram showing a relation between a breakdown voltage and a breakdown probability in MOS capacitor made through the present invention.

A breakdown characteristic of an MOS capacitor with a silicon oxide layer of 5 nm thickness whose surface was cleaned by the present invention before oxidation thereof as shown in FIG. 8 is remarkably improved in comparison with a breakdown characteristic of an MOS capacitor with a silicon oxide layer of 5 nm thickness whose surface was cleaned by a conventional cleaning method before oxidation thereof as shown in FIG. 7, because a surface roughness of the silicon substrate before the oxidation thereof according to the present invention is significantly smaller than the surface roughness of the silicon substrate before the oxidation thereof according to the prior art, and the smaller the surface roughness of the silicon substrate before the oxidation thereof is, the smaller a roughness and crystal lattice imperfection of each of a silicon oxide layer surface and a boundary surface between the silicon oxide layer and the silicon substrate thereunder after the oxidation are. Of course, the present invention can be applied to a MOSFET production process or the like, before the oxidation of the silicon substrate surface.

What is claimed is:

1. A method for removing an organic or inorganic contaminant on a silicon substrate surface, said method comprising:

causing a temperature of the organic or inorganic contaminant on the silicon substrate surface to be not less than 7500° C.; and exposing the organic or inorganic contaminant to a gas including ozone while the temperature of the organic or inorganic contaminant is not less than 750° C. and a partial pressure formed by at least one of oxygen atoms (O), oxygen molecules ($O_2$) and ozone molecules ($O_3$) over the organic or inorganic contaminant on the silicon substrate surface is not higher than $10^1$ Pa to prevent the silicon substrate surface from being oxidized.

2. A method according to claim 1, wherein the organic or inorganic contaminant on the silicon substrate surface is heated to the temperature not less than 750° C. after being exposed to the gas.

3. A method according to claim 1, wherein the organic or inorganic contaminant on the silicon substrate surface is exposed to the gas before at least a part of the organic or inorganic contaminant over the silicon substrate surface is substantially removed in such a degree that an undesirable chemical change of the silicon substrate surface is generated by at least one of the gas and heating of silicon substrate.

4. A method according to claim 1, wherein the organic or inorganic contaminant on the silicon substrate surface is heated to the temperature not less than 750° C. before being exposed to the gas.

5. A method according to claim 1, wherein the organic or inorganic contaminant on the silicon substrate surface is heated to the temperature not less than 750° C. substantially simultaneously with being exposed to the gas.

6. A method according to claim 1, wherein the organic or inorganic contaminant includes a silicon oxide.

7. A method according to claim 1, wherein the organic or inorganic contaminant includes a hydrocarbon.

8. A method according to claim 1, wherein the temperature is not larger than 1100° C.

9. A method according to claim 1, wherein a partial pressure formed by oxygen over the organic or inorganic contaminant on the silicon substrate surface is not higher than $10^{-4}$ Pa.

10. A method according to claim 1, wherein a partial pressure formed by at least one of oxygen atomics (O), oxygen molecules ($O_2$) and ozone molecules ($O_3$) over the organic or inorganic contaminant on the silicon substrate surface is not higher than $10^{-4}$ Pa.

11. A method according to claim 1, wherein the gas is substantially prevented from including at least one of carbon and carbide.

12. A method according to claim 1, wherein the gas further includes at least one of oxygen molecule, hydrogen molecule and inert gas.

13. A method according to claim 1, wherein the ozone is formed by applying ultraviolet rays to oxygen molecule gas.

14. A method according to claim 1, wherein the ozone is formed over the organic or inorganic contaminant by supplying both of ultraviolet rays and oxygen molecule gas onto the organic or inorganic contaminant.

15. A method according to claim 1, wherein the gas flows onto the organic or inorganic contaminant.

16. A method according to claim 1, wherein the silicon substrate surface is also heated to the temperature not less than 750° C.

17. A method according to claim 1, wherein the ozone is substantially completely discharged from the silicon substrate surface when the silicon substrate surface is cooled below 750° C., after the organic or inorganic contaminant on the silicon substrate surface is kept at the temperature not less than 750° C. while being exposed to the gas.

18. A method according to claim 1, wherein the gas flows from the silicon substrate surface toward an area whose gas pressure is not higher than $10^{-7}$ Pa.

19. A method according to claim 1, wherein a circumferential gas pressure over the organic or inorganic contaminant on the silicon substrate surface is not higher than the atmospheric pressure.

20. A method according to claim 1, wherein said organic or inorganic contaminant comprises an organic contaminant and a silicon oxide.

21. A silicon substrate having a silicon substrate surface cleaned by the process of claim 1, wherein the silicon substrate surface has a roughness not exceeding 0.034 nm.

* * * * *